United States Patent
Lo et al.

(10) Patent No.: US 9,269,862 B2
(45) Date of Patent: Feb. 23, 2016

(54) LIGHT-EMITTING DEVICE

(71) Applicant: EPISTAR CORPORATION, Hsinchu (TW)

(72) Inventors: Wu-Tsung Lo, Hsinchu (TW); Yu-Chih Yang, Hsinchu (TW); Chien-Ming Wu, Hsinchu (TW); Kai-Yi Hong, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 58 days.

(21) Appl. No.: 14/093,252

(22) Filed: Nov. 29, 2013

(65) Prior Publication Data

US 2015/0155433 A1    Jun. 4, 2015

(51) Int. Cl.
*H01L 33/10* (2010.01)
*H01L 33/32* (2010.01)
*H01L 33/30* (2010.01)
*H01L 33/46* (2010.01)

(52) U.S. Cl.
CPC .............. *H01L 33/10* (2013.01); *H01L 33/46* (2013.01); *H01L 33/465* (2013.01)

(58) Field of Classification Search
CPC .............................. H01L 33/10; H01L 33/465
See application file for complete search history.

(56) References Cited

U.S. PATENT DOCUMENTS 5,881,085 A * 3/1999 Jewell ...................... 372/46.013
6,317,446 B1 * 11/2001 Wipiejewski ............. 372/46.01

* cited by examiner

*Primary Examiner* — Robert Carpenter
(74) *Attorney, Agent, or Firm* — Muncy, Geissler, Olds & Lowe, P.C.

(57) ABSTRACT

A light-emitting device includes: a Distributed Bragg reflector comprising alternate first semiconductor layers and second semiconductor layers, wherein each first semiconductor layer comprises a low-refractive-index part having a depth; and a light-emitting semiconductor stack associated with the Distributed Bragg reflector; wherein the depths of the low-refractive-index parts of the first semiconductor layers are gradually changed in a direction toward the light-emitting semiconductor stack.

19 Claims, 9 Drawing Sheets

US 9,269,862 B2

LIGHT-EMITTING DEVICE

TECHNICAL FIELD

The present application relates to a light-emitting device, and particularly to a light-emitting device with high brightness and with a directional radiation pattern.

DESCRIPTION OF BACKGROUND ART

Light-emitting diodes are power-saving and highly-efficient light sources, and can be applied to lighting, backlights in displays, and traffic indicators, etc. based on different wavelengths of emitted light. In addition to different requirements of wavelengths of emitted light, desired radiation patterns of the emitted light and enhanced brightness are also required according to different needs of each application.

In order to obtain desired radiation patterns, housing packages, lenses and reflectors are adopted to adjust radiation patterns. FIG. 12 shows a radiation pattern of a light-emitting diode chip 100. Referring to FIG. 13 to FIG. 14, to improve the vertical spread of the radiation pattern, a housing package 200 or a lens 300 can be used to package a light-emitting diode chip 100, so as to obtain a directional radiation pattern of the light-emitting diode chip. However, the volume of the packaged light-emitting diode chip is much larger than the volume of the original light-emitting diode chip.

Referring to FIG. 15, a conventional light-emitting diode chip 100 comprises a substrate 101, a Distributed Bragg Reflector structure 102 on one surface of the substrate 101, an active layer 103 on the Distributed Bragg Reflector structure, a capping layer 104 on the active layer, a first electrode 105 on the capping layer 104, and a second electrode 106 on another surface of the substrate 101 opposite to the Distributed Bragg Reflector structure 102. After injecting a current through the first electrode 105 and through the conventional light-emitting diode chip 100, the active layer 103 emits light. As shown in FIG. 12, an emission light 1031 substantially normal to the active layer 103 and towards the capping layer 104 escapes from the front of the conventional light-emitting diode chip 100, and an emission light 1032 substantially normal to the Distributed Bragg Reflector structure 102 and towards the substrate 101 escapes from the front of the conventional light-emitting diode chip 100 as well after being reflected by the Distributed Bragg Reflector structure 102 reflecting emission at specific wavelength. However, an emission light 1033 impinging on the Distributed Bragg Reflector structure 102 at an oblique angle of incidence escapes downwardly from the side of the conventional light-emitting diode chip 100 through refraction. As a result, the conventional light-emitting diode chip enhances only reflection of normal incidence instead of concentrating light escaping from the side of the conventional light-emitting diode chip to the front of the conventional light-emitting diode chip, and the efficiency thereof is not very good. Besides, a housing package or a lens is needed to adjust the radiation pattern.

Nevertheless, equipment and electronic devices nowadays follow the trend towards downsizing, and thus the conventional packaged light-emitting diodes are difficult to apply to the downsized equipment or electronic devices due to the enlarged volume after packaging.

The above light-emitting diode is able to combine with a submount to form a lighting device. The lighting device comprises a submount with a circuit; a solder on the submount, by which the above light-emitting diode can be fixed on the submount, and the substrate of the above light-emitting diode is electrically connected to the circuit on the submount; and an electrical connection structure for electrically connecting the pads of the light-emitting diode and the circuit on the submount; wherein the above submount could be a lead frame or a large mounting substrate for facilitating the design of the electrical circuit of the lighting device and increasing the heat dissipation efficiency.

SUMMARY OF THE DISCLOSURE

A light-emitting device comprises: a Distributed Bragg reflector comprising alternate first semiconductor layers and second semiconductor layers, wherein each first semiconductor layer comprises a low-refractive-index part having a depth; and a light-emitting semiconductor stack associated with the Distributed Bragg reflector; wherein the depths of the low-refractive-index parts of the first semiconductor layers are gradually changed in a direction toward the light-emitting semiconductor stack.

DETAILED DESCRIPTION OF PREFERRED EMBODIMENTS

Figure 1:
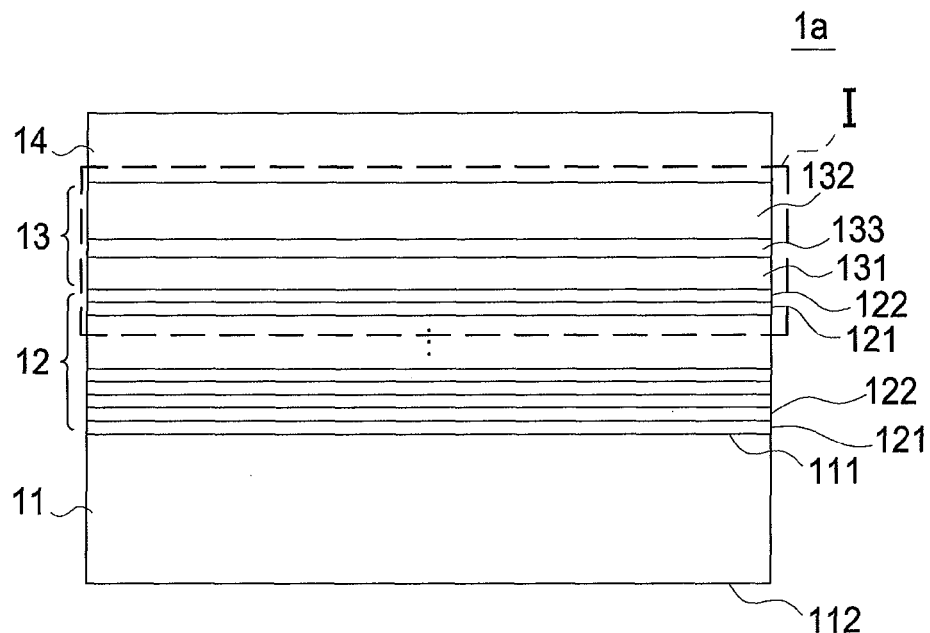
FIG. 1 is a cross-sectional diagram showing a light-emitting chip in accordance with the first embodiment of the present application.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

First Embodiment

The first embodiment of the present application is illustrated in FIG. 1 to FIG. 4. The structure and manufacturing process of the light-emitting device 10a in accordance with the first embodiment of the present application are as follows. A light-emitting chip 1a is provided. The light-emitting chip 1a comprises a substrate 11, a Distributed Bragg reflector 12 on the substrate 11, a light-emitting semiconductor stack 13 on the Distributed Bragg reflector 12, and a window layer 14 on, the light-emitting semiconductor stack 13, wherein the light-emitting semiconductor stack 13 comprises a first type semiconductor layer 131 proximal to the Distributed Bragg reflector 12, a second type semiconductor layer 132, and a light-emitting layer 133 between the first type semiconductor layer 131 and the second type semiconductor layer 132.

The substrate 11 supports all the elements thereon and comprises a first surface 111 and a second surface 112 opposite to the first surface 111. The material of the substrate 11 comprises insulating material, e.g. silicone, glass, quartz, ceramic, or $Al_xN$, non-conductive material, transparent material or non-transparent material. In the present embodiment, the material of the substrate 11 is GaAs.

Figure 2:
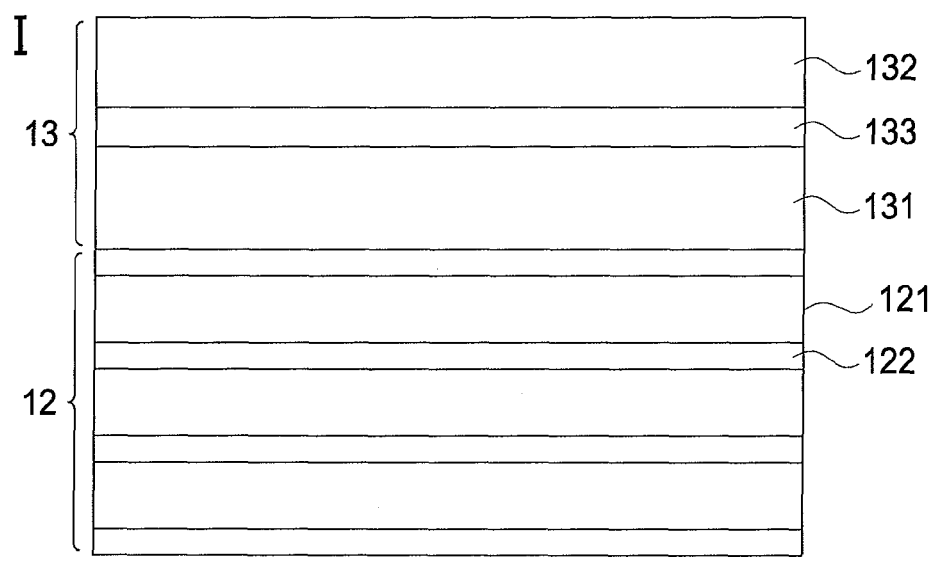
FIG. 2 is a cross-sectional diagram showing an enlarged detail of region I in FIG. 1.

FIG. 2 is a cross-sectional diagram showing an enlarged detail of region I in FIG. 1. The Distributed Bragg reflector 12 is on the first surface 111 of the substrate 11 and comprises alternate first semiconductor layers 121 and second semiconductor layer 122. The number of the first semiconductor layers 121 and the number of the second semiconductor layers 122 are, but not limited to 20, respectively. The material of the first semiconductor layers 121 and the second semiconductor layers 122 comprises semiconductor materials. More specifically, the material of each first semiconductor layers 121 comprises a first Group III-V semiconductor material comprising Al and the material of each second semiconductor layer 122 comprises a second Group III-V semiconductor material comprising Al. Each first semiconductor layer 121 has a first aluminum concentration and each second semiconductor layer 122 has a second aluminum concentration, wherein the first aluminum concentration is the amount of aluminum relative to the total Group III elements in the first Group III-V semiconductor material and the second aluminum concentration is the amount of aluminum relative to the total Group III elements in the second Group III-V semiconductor material. The first aluminum concentrations of the first semiconductor layers 121 are gradually changed in a direction from the substrate 11 toward the light-emitting semiconductor stack 13. In the present embodiment, the first aluminum concentrations of the first semiconductor layers 121 are gradually decreased in a direction from the substrate 11 toward the light-emitting semiconductor stack 13. The second aluminum concentrations are substantially the same and are lower than the lowest first aluminum concentration among the first aluminum concentrations. More preferably, each aluminum concentration of each first semiconductor layer 121 is not less than 80 percent of total Group III elements in the first Group III-V semiconductor material. More preferably, the first Group III-V semiconductor material is selected from the group consisting of: $Al_xGa_{(1-x)}As$, $Al_xGa_{(1-x)}P$, $Al_xGa_{(1-x)}AsP$, $Al_xAs_{(1-x)}Sb$, $Al_xIn_{(1-x)}GaP$, and $Al_xGa_{(1-x)}N$, wherein x is not less than 0.8. More preferably, x ranges from 0.8 to 0.99. More preferably, x ranges from 0.9 to 0.99. The second Group III-V semiconductor material is selected from the group consisting of: $Al_yGa_{(1-y)}As$, $Al_yGa_{(1-y)}P$, $Al_yGa_{(1-y)}AsP$, $Al_yAs_{(1-y)}Sb$, $Al_yIn_{(1-y)}GaP$, and $Al_yGa_{(1-y)}N$, wherein y is less than 0.8. Preferably, y is less than 0.5. More preferably, y is less than 0.2. In the present embodiment, the material in the first semiconductor layer 121 that is the nearest to the substrate 11 is $Al_{0.95}Ga_{0.05}As$, and the material in the first semiconductor layer 121 that is the farthest to the substrate 11 is $Al_{0.8}Ga_{0.2}As$, and the first aluminum concentrations of other first semiconductor layers 121 are between 95 percent (excluded) and 80 percent (excluded) of total Al and Ga elements in the first Group III-V semiconductor material and those first aluminum concentrations are gradually decreased in a direction from the substrate 11 toward the light-emitting semiconductor stack 13. More specifically, each first aluminum concentration of the first semiconductor layers 121 is a fixed value. In the present embodiment, the second Group III-V semiconductor material in each second semiconductor layer 122 is $Al_{0.12}Ga_{0.88}As$. Each first semiconductor layer 121 has a first refractive index, and the first refractive indices are gradually changed in a direction from the substrate 11 toward the light-emitting semiconductor stack 13. In the present embodiment, the first refractive indices are gradually increased in a direction from the substrate 11 toward the light-emitting semiconductor stack, 13, and each first refractive index is a fixed value. The refractive indices of the second semiconductor layers 122 are substantially the same and are higher than the highest first refractive index among the first semiconductor layers 121. Each thickness of the first semiconductor layers 121 is larger than each thickness of the second semiconductor layers 122. In the present embodiment, each thickness of the second semiconductor layers 122 is 680 Å, and each thickness of the first semiconductor layers 121 is larger than 1000 Å.

Referring to FIG. 1 and FIG. 2, when the first type semiconductor layer 131 is a p-type semiconductor, the second type semiconductor layer 132 can be an n-type semiconductor, whose electrical polarity is different from that of the first type semiconductor layer 131. On the other hand, when the first type semiconductor layer 131 is an n-type semiconductor, the second semiconductor type layer can be a p-type semiconductor, whose electrical polarity is different from that of the first type semiconductor layer 131. The light-emitting layer 133 could be an intrinsic, an n-type, or a p-type semiconductor. The structure of the light-emitting layer 133 can be single heterostructure (SH), double heterostructure (DH), double-side double heterostructure (DDH) or multi-quantum well (MQW), wherein the wavelength of the light emitted from the light-emitting layer 133 can be changed by adjusting the number of MOW pairs.

The window layer 14 is proximal to the second type semiconductor layer 132 of the light-emitting semiconductor stack 13, and the electrical polarity of the window layer 14 can be the same as that of the second type semiconductor layer 132. The window layer 14 is transparent to the light emitted from the light-emitting semiconductor stack 13. The material of the window layer 14 comprises indium tin oxide (ITO), indium oxide (InO), tin oxide (SnO), cadmium tin oxide (CTO), antimony tin oxide (ATO), aluminium zinc oxide (AZO), zinc tin oxide (ZTO), zinc oxide (ZnO), gallium doped zinc oxide (GZO), indium tungsten oxide (IWO), magnesium oxide (MgO), indium zinc oxide (IZO) or Group III-V semiconductor material, wherein the Group III-V semiconductor material comprises AlGaAs, GaN, GaP, GaAs, InGaAs, AlGaInP or InGaP.

Figure 3:
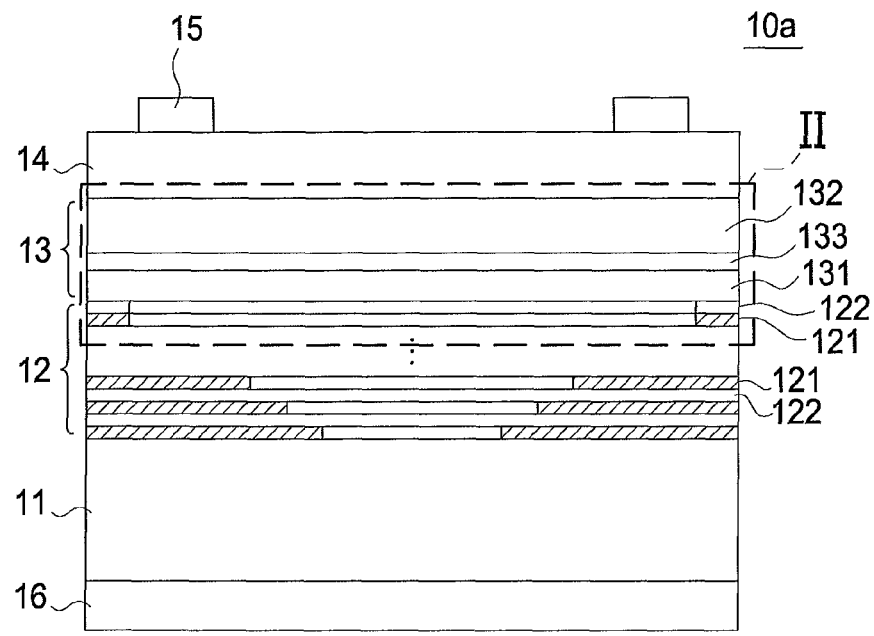
FIG. 3 is a cross-sectional diagram showing a light-emitting device in accordance with the first embodiment of the present application.
Figure 4:
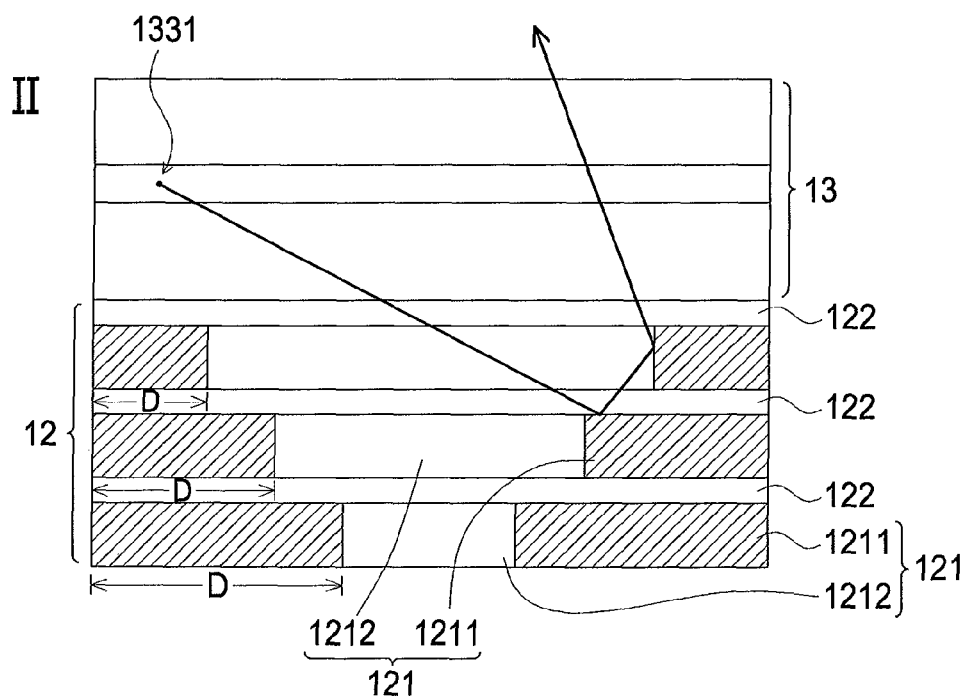
FIG. 4 is a cross-sectional diagram showing an enlarged detail of region II in FIG. 1.

The light-emitting chip 1a as shown in FIG. 1 and FIG. 2 then undergoes an oxidization process to oxidize a part of each first semiconductor layer 121, wherein the oxidization process comprises wet thermal oxidation. During the oxidization process, each first semiconductor layer 121 is oxidized from outermost and the periphery portion is exposed while other structures such as the light-emitting semiconductor stack 13 and the second semiconductor layers 122 are substantially unaffected. Referring to FIG. 3 and FIG. 4, after the oxidization process, the light-emitting device 10a is obtained, wherein each first semiconductor layer 121 comprises a low-refractive-index part 1211 and a high-refractive-index part 1212 surrounded by the corresponding low-refractive-index part 1211. Each of the high-refractive-index part 1212 has the first refractive index of the corresponding first semiconductor layers 121 as mentioned above since each of the high-refractive-index part 1212 is substantially unaffected during the oxidization process. Each low-refractive-index part 1211 has a second refractive index and the second refractive indices are substantially the same and are lower than the lowest first refractive index among the high-refractive-index parts 1212. More specifically, the refractive index of each low-refractive-index part 1211 is less than 2 at the wavelength of the light emitted from the light-emitting layer 133. More preferably, the refractive index of each low-refractive-index part 1211 ranges from 1 to 2. The second refractive index of each low-refractive-index part 1211 is lower than each refractive index of the second semiconductor layers 122. More preferably, a difference between the second refractive index and the refractive index of the second semiconductor layers 122 is not less than 1, more preferably, ranges from 0.83 to 2.2. Each low-refractive-index part 1211 has a depth D defined as a distance from the outermost exposed edge of each low-refractive-index part 1211 to the interface of the low-refractive-index part 1211 and the high-refractive-index part 1212. Besides, the depths D of the low-refractive-index parts 1211 of the first semiconductor layers 121 are gradually changed in a direction from the substrate 11 toward the light-emitting semiconductor stack 13. In the present embodiment, the depths D of the low-refractive-index parts 1211 of the first semiconductor layers 121 are gradually decreased in a direction from the substrate 11 toward the light-emitting semiconductor stack 13. The material of each low-refractive-index parts 1211 of the first semiconductor layers 121 comprises aluminum oxide whose empirical formula is $Al_aO_b$, wherein a and b are natural numbers excluding 0.

A first electrode 15 is then formed to be electrically connected to the window layer 14 by evaporation, deposition or electroplating followed by photolithography, and a second electrode 16 is formed on and is electrically connected to the second surface 112 of the substrate 11 by evaporation, deposition or electroplating. After applying an external voltage, a current flows between the first electrode 15 and the second electrode 16. The material of the first electrode 15 and the second electrode 16 comprises transparent conductive oxide material, metal material, or Group III-V semiconductor material. The transparent conductive oxide material comprises indium tin oxide (ITO), indium oxide (InO), tin oxide (SnO), cadmium tin oxide (CTO), antimony tin oxide (ATO), aluminum zinc oxide (AZO), zinc tin oxide (ZTO), zinc oxide (ZnO), gallium doped zinc oxide (GZO), indium tungsten oxide (IWO), magnesium oxide (MgO) or indium zinc oxide (IZO). The metal material comprises Al, Cr, Cu, Sn, Au, Ni, Ti, Pt, Pb, Zn, Cd, Sb, Co or the alloys thereof. The Group III-V semiconductor material comprises AlGaAs, GaN, GaP, GaAs, or GaAsP.

Figure 5:
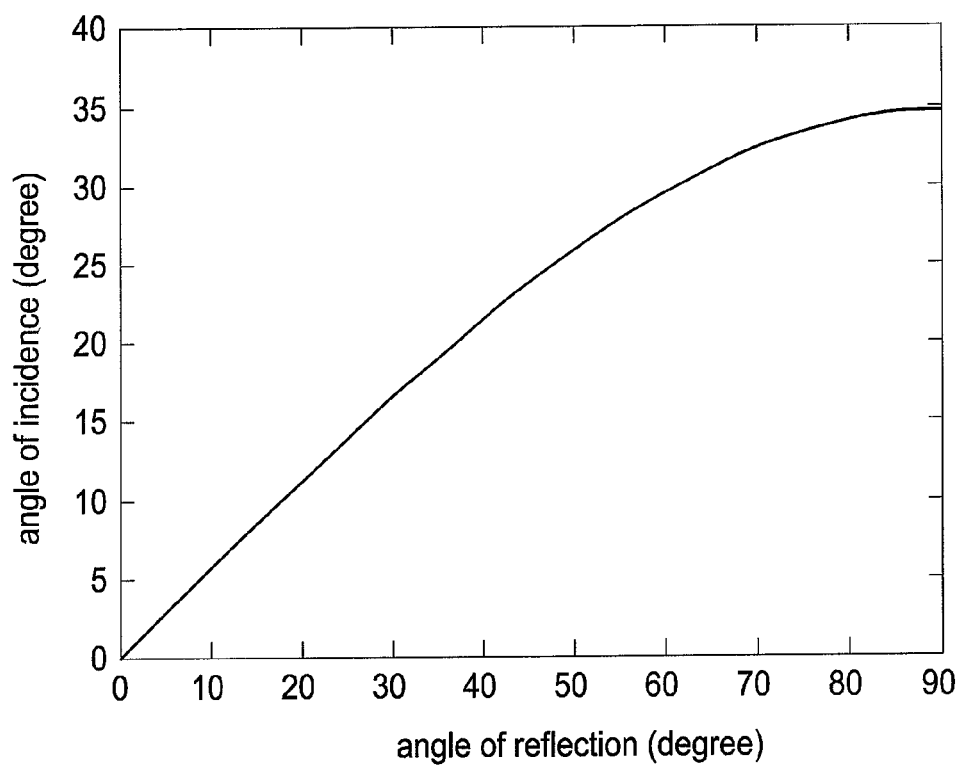
FIG. 5 is a graph showing a relation between the angle of incidence and the angle of reflection of an emitted light impinging on one of the low-refractive-index part from the adjacent second semiconductor layer in accordance with the first embodiment of the present application.

FIG. 5 is a graph showing a relation between the angle of incidence and the angle of reflection of an emitted light impinging on one of the low-refractive-index part 1211 from the adjacent second semiconductor layer 122 in accordance with the first embodiment of the present application. As shown in FIG. 5, the critical angle of the second semiconductor layer 122/the high-refractive-index part 1212 interface is near 35 degrees. As shown in FIG. 4, an emitted light 1331 impinges on the Distributed Bragg reflector at an oblique angle of incidence passes through several second semiconductor layers 122 and several high-refractive-index parts 1212 and is reflected until the emitted light 1331 encounters one of the low-refractive-index parts 1211 since the difference between the second refractive index of the low-refractive-index parts 1211 and the refractive index of the second semiconductor layers 122 is large enough, and the reflected light toward the side of the light-emitting device 10a is reflected again by another low-refractive-index part 1211, and thus the light-emitting device of the present application concentrates light to the front of the light-emitting device. Furthermore, the light-emitting device gathers the current to the region of the Distributed Bragg reflector 12 excluding the low-refractive-index parts since the low-refractive-index parts 1211 are substantially electrically insulated. Accordingly, the efficiency of the light-emitting device is enhanced and a directional radiation pattern is obtained.

Second Embodiment

Figure 6:
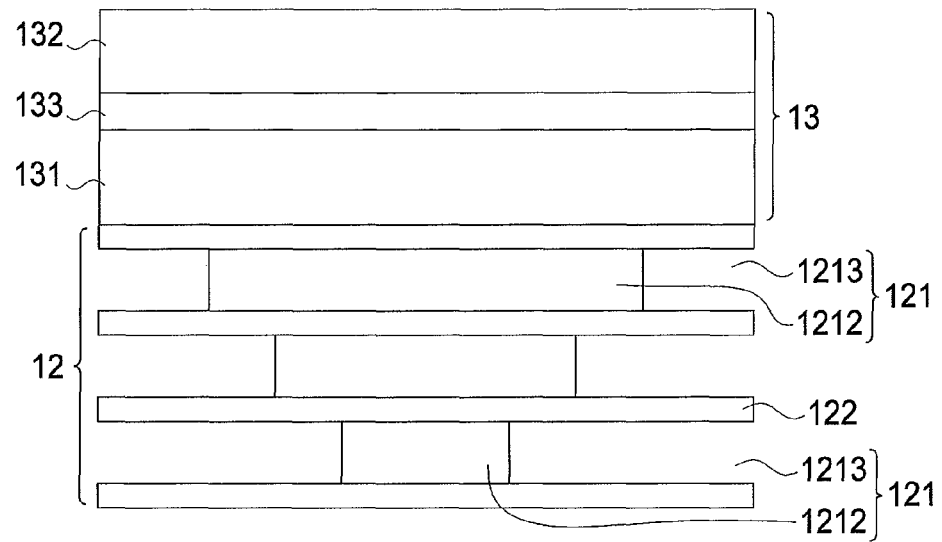
FIG. 6 is a cross-sectional diagram showing a partial section of a light-emitting device in accordance with the second embodiment of the present application.

FIG. 6 is a cross-sectional diagram showing a partial section of a light-emitting device in accordance with the second embodiment of the present application. The difference between the second embodiment and the first embodiment is that each low-refractive-index part 1211 of the first semiconductor layers 121 is removed to form a trench 1213 by an etching step before forming the first electrode 15.

Third Embodiment

Figure 7:
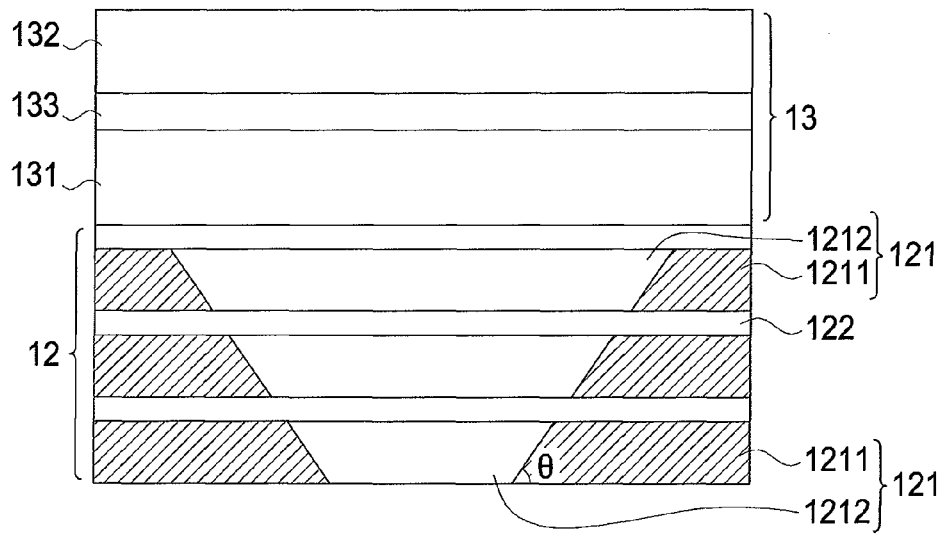
FIG. 7 is a cross-sectional diagram showing a partial section of a light-emitting device in accordance with the third embodiment of the present application.

FIG. 7 is a cross-sectional diagram showing a partial section of a light-emitting device in accordance with the third embodiment of the present application. The difference between the third embodiment and the first embodiment is that each first aluminum concentration of the high-refractive-index parts 1212 further gradually changes in a direction from the substrate 11 toward the light-emitting semiconductor stack 13, namely, each first aluminum concentration of the high-refractive-index parts 1212 is not a fixed value in a direction from the substrate 11 toward the light-emitting semiconductor stack 13.

In the present embodiment, the first aluminum concentration of the first semiconductor layer 121 that is the nearest to the substrate 11 gradually decreases from 95 percent to 94 percent of total Al and Ga elements in the first Group III-V semiconductor material in a direction from the substrate 11 toward the light-emitting semiconductor stack 13, and the first aluminum concentration of the first semiconductor layer 121 that is the farthest to the substrate 11 gradually decreases from 81 percent to 80 percent of total Al and Ga elements in the first Group III-V semiconductor material in a direction from the substrate 11 toward the light-emitting semiconductor stack 13, and the first aluminum concentrations of other first semiconductor layers 121 are between 94 percent (excluded) and 81 percent (excluded) of total Al and Ga elements in the first Group III-V semiconductor material and those first aluminum concentrations are gradually decreased in a direction from the substrate 11 toward the light-emitting semiconductor stack 13, and each first aluminum concentration is gradually decreased in a same direction as well. Furthermore, each depth of each low-refractive-index part 1211 gradually changes in a direction toward the light-emitting semiconductor stack 13 respectively. In the present embodiment, each depth of each low-refractive-index part 1211 gradually decreased in a direction toward the light-emitting semiconductor stack 13 respectively. More specifically, each interface of the low-refractive-index part 1211 and the high-refractive-index part 1212 in the first semiconductor layers 121 is inclined relative to a plane substantially parallel to each second semiconductor layer 122 to define an angle θ. Furthermore, the angle θ ranges from 10 degrees to 80 degrees, and more preferably, ranges from 30 degrees to 60 degrees.

Fourth Embodiment

Figure 8:
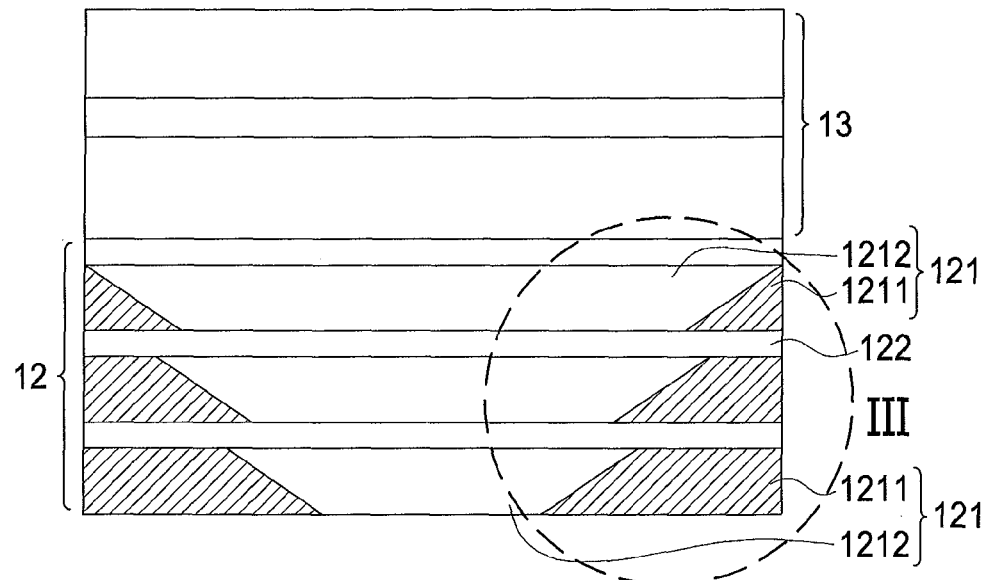
FIG. 8 is a cross-sectional diagram showing a partial section of a light-emitting device in accordance with the fourth embodiment of the present application.
Figure 9:
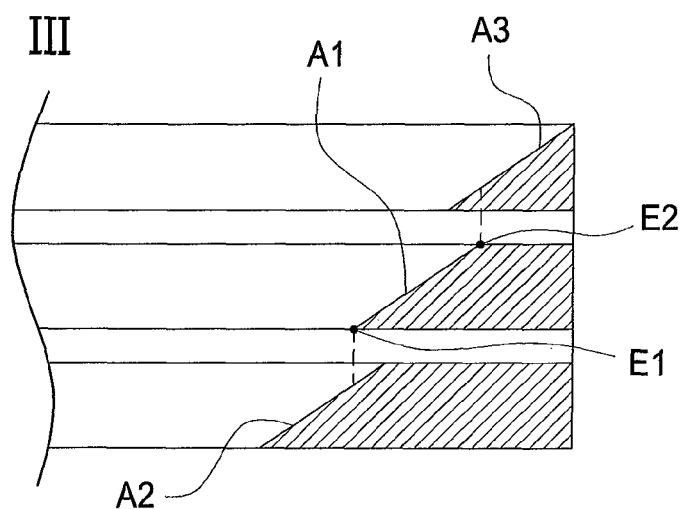
FIG. 9 is a cross-sectional diagram showing an enlarged detail of region III in FIG. 8.

FIG. 8 is a cross-sectional diagram showing a partial section of a light-emitting device in accordance with the fourth embodiment of the present application. The difference between the fourth embodiment and the third embodiment is that each first aluminum concentration of the first semiconductor layers 121 gradually varies over a range respectively, and the range of the first aluminum concentration of any one of the first semiconductor layers 121 overlaps part of the range of the first aluminum concentration of another first semiconductor layer 121, and the maximum value of the first aluminum concentrations gradually decreased in a direction from the substrate 11 toward the light-emitting semiconductor stack 13. In the present embodiment, the first aluminum concentration of the first semiconductor layer 121 that is the farthest to the substrate 11 gradually decreases from 91 percent to 90 percent of total Al and Ga elements in the first Group III-V semiconductor material in a direction from the substrate 11 toward the light-emitting semiconductor stack 13, and the first aluminum concentration of an adjacent first semiconductor layer 121 gradually decreases from 91.5 percent to 90.5 percent of total Al and Ga elements in the first Group III-V semiconductor material in a same direction. Furthermore, the first aluminum concentration of the first semiconductor layer 121 that is the nearest to the substrate 11 gradually decreases from 99.5 percent to 98.5 percent of total Al and Ga elements in the first Group III-V semiconductor material in a direction from the substrate 11 toward the light-emitting semiconductor stack 13, and an adjacent first semiconductor layer 121 gradually decreases from 99 percent to 98 percent of total Al and Ga elements in the first Group III-V semiconductor material in a same direction. Specifically, the first aluminum concentrations of other first semiconductor layer 121 gradually decrease in a same way. Furthermore, each interface of the low-refractive-index part 1211 and the high-refractive-index part 1212 has two edges, and the vertical projection of one of the edges of the interface falls on the adjacent interface. Specifically, as shown in FIG. 9, an interface A1 has two edges E1 and E2, a vertical projection of one of the edge E1 falls on one of the adjacent interfaces A2, and a vertical projection of the other edge E2 falls on the other adjacent interface A3.

Fifth Embodiment

Figure 10:
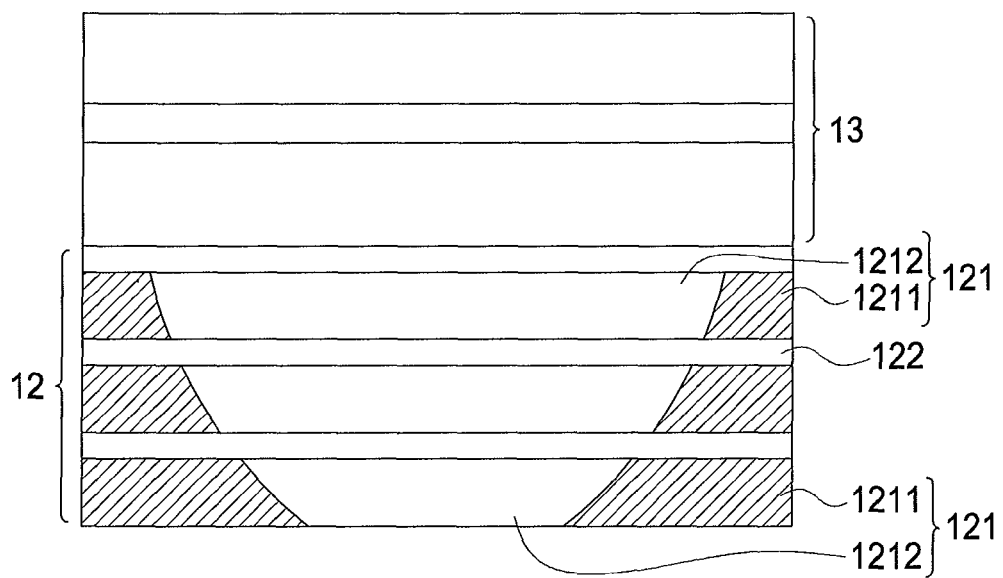
FIG. 10 is a cross-sectional diagram showing a partial section of a light-emitting device in accordance with the fifth embodiment of the present application.

FIG. 10 is a cross-sectional diagram showing a partial section of a light-emitting device in accordance with the fourth embodiment of the present application. The difference between the fifth embodiment and the third embodiment is that the each interface of the low-refractive-index part 1211 and the high-refractive-index part 1212 is a curved surface, which is caused by a relative small variation in oxidation rate compared with the third embodiment. Specifically, the variation in oxidation rate can be controlled by adjusting each first aluminum concentration and/or the conditions, such as temperature, in the oxidation process.

Sixth Embodiment

Figure 11:
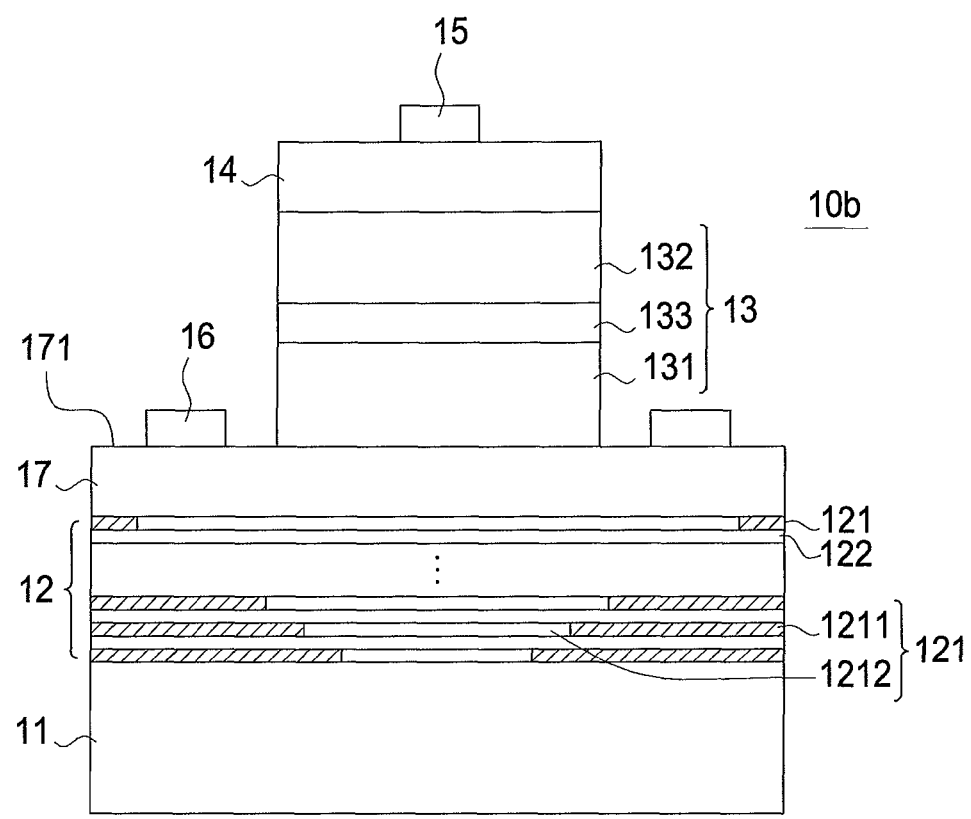
FIG. 11 is a cross-sectional diagram showing a light-emitting device in accordance with the sixth embodiment of the present application.
Figure 12:
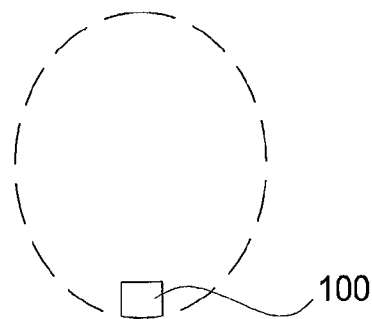
FIG. 12 is a diagram showing a radiation pattern of a conventional light-emitting diode chip.
Figure 13:
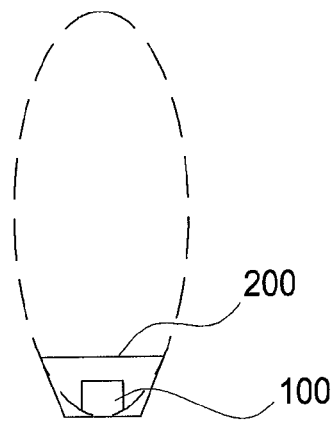
FIG. 13 is a diagram showing a radiation pattern of a conventional packaged light-emitting diode chip.
Figure 14:
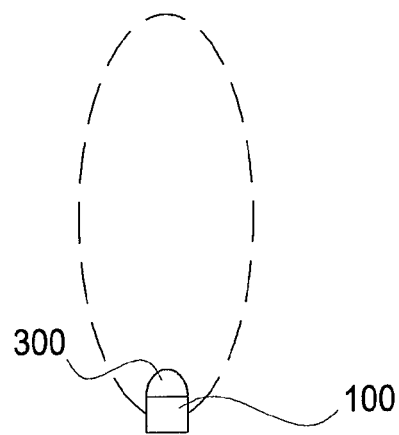
FIG. 14 is a diagram showing a radiation pattern of a conventional packaged light-emitting diode chip.
Figure 15:
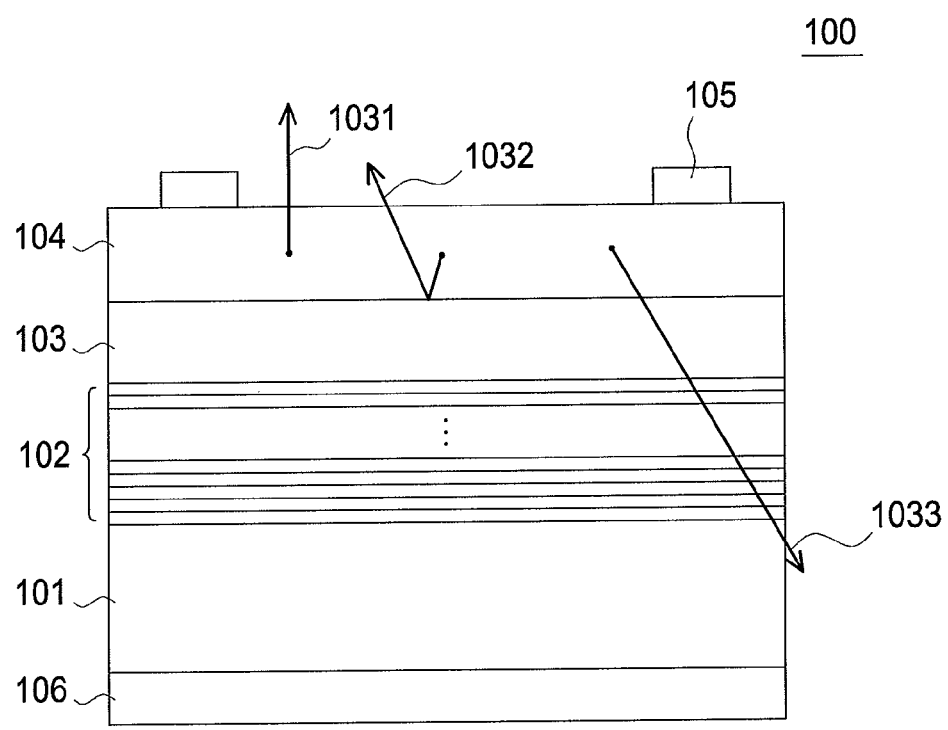
FIG. 15 is a cross-sectional diagram showing a conventional light-emitting diode chip.

FIG. 11 is a cross-sectional diagram showing a light-emitting device 10b in accordance with the fourth embodiment of the present application. The difference between the fourth embodiment and the first embodiment is that an electrode contact layer 17 is formed between and is electrically to the Distributed Bragg reflector 12 and the light-emitting semiconductor stack 13. The width of the light-emitting semiconductor stack 13 and the width of the window layer 14 are smaller than the width of the electrode contact layer 17, and the electrode contact layer 17 therefore has a mesa wall 171 proximal to the light-emitting semiconductor stack 13. The second electrode 16 is formed on the mesa wall 171 and is ohmic electrically connected to the electrode contact layer 17. The electrical polarity of the electrode contact layer 17 can be the same as that of the first type semiconductor layer 131. The material of the electrode contact layer 17 comprises Ga, Al, In, P, N, Zn, Cd, Se or the combinations thereof.

In another embodiment, the light-emitting device comprises two Distributed Bragg reflectors and the light-emitting semiconductor stack is between the two Distributed Bragg reflectors, namely, the light-emitting device is a vertical-cavity surface emitting laser.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A light-emitting device, comprising:
   a substrate;
   a light-emitting semiconductor stack on the substrate and having a first side and a second side opposite to the first side; and
   a Distributed Bragg reflector on the first side of the light-emitting semiconductor stack and comprising alternate first semiconductor layers and second semiconductor layers, wherein each first semiconductor layer comprises a low-refractive-index part having a depth,
   wherein the depths of the low-refractive-index parts of the first semiconductor layers are gradually decreased in a direction from the substrate toward the light-emitting semiconductor stack, and the light-emitting device is devoid of any Distributed Bragg reflector on the second side of the light-emitting semiconductor stack.

2. The light-emitting device according to claim 1, wherein each first semiconductor layer comprises a high-refractive-index part surrounded by the corresponding low-refractive-index part.

3. The light-emitting device according to claim 2, wherein a material of each high-refractive-index part comprises a first Group III-V semiconductor material comprising Al.

4. The light-emitting device according to claim 3, wherein each aluminum concentration of the high-refractive-index parts is not less than 80 percent of total Group III elements in the first Group III-V semiconductor material.

5. The light-emitting device according to claim 4, wherein the first Group III-V semiconductor material is selected from the group consisting of $Al_xGa_{(1-x)}As$, $Al_xGa_{(1-x)}P$, $Al_xGa_{1-x}AsP$, $Al_xAs_{(1-x)}Sb$, $Al_xIn_{(1-x)}GaP$, and $Al_xGa_{(1-x)}N$, wherein x is not less than 0.8.

6. The light-emitting device according to claim 2, wherein each high-refractive-index part has a first aluminum concentration and the first aluminum concentrations of the first semiconductor layers are gradually decreased in a direction from the substrate toward the light-emitting semiconductor stack.

7. The light-emitting device according to claim 6, wherein each second semiconductor layer has a second aluminum concentration, and the second aluminum concentrations are substantially the same and are lower than the lowest first aluminum concentration among the first aluminum concentrations.

8. The light-emitting device according to claim 2, wherein each high-refractive-index part has a first refractive index and the first refractive indices are gradually decreased in a direction from the substrate toward the light-emitting semiconductor stack, and each low-refractive-index part has a second refractive index and the second refractive indices are substantially the same and are lower than the lowest first refractive index among the high-refractive-index parts.

9. The light-emitting device according to claim 2, wherein each high-refractive-index part has an aluminum gradient in a direction from the substrate toward the light-emitting semiconductor stack respectively.

10. The light-emitting device according to claim 2, wherein each interface of the low-refractive-index part and the high-refractive-index part in the first semiconductor layers is inclined relative to a plane substantially parallel to each second semiconductor layer to define an angle ranging from 10 degrees to 80 degrees.

11. The light-emitting device according to claim 2, wherein each interface of the low-refractive-index part and the high-refractive-index part in the first semiconductor layers is a curved surface.

12. The light-emitting device according to claim 1, wherein the material of each second semiconductor layer comprises a second Group III-V semiconductor material comprising Al.

13. The light-emitting device according to claim 12, wherein the second Group III-V semiconductor material is selected from the group consisting of $Al_yGa_{(1-y)}As$, $Al_yGa_{(1-y)}P$, $Al_yGa_{(1-y)}AsP$, $Al_yAs_{(1-y)}Sb$, $Al_yIn_{(1-y)}GaP$, and $Al_yGa_{(1-y)}N$, wherein y is less than 0.8.

14. The light-emitting device according to claim 1, wherein each low-refractive-index part has a second refractive index and each second refractive index is lower than each refractive index of the second semiconductor layers.

15. The light-emitting device according to claim 14, wherein a difference between the second refractive index and the refractive index of the second semiconductor layers is not less than 1.

16. The light-emitting device according to claim 1, wherein a refractive index of each low-refractive-index part is less than 2.

17. The light-emitting device according to claim 1, wherein each low-refractive-index part is in a trench.

18. The light-emitting device according to claim 1, wherein each depth of each low-refractive-index part gradually decreases in a direction from the substrate toward the light-emitting semiconductor stack respectively.

19. The light-emitting device according to claim 1, wherein each thickness of the first semiconductor layers is larger than each thickness of the second semiconductor layers.

* * * * *